United States Patent
Tseng et al.

(10) Patent No.: US 10,044,357 B1
(45) Date of Patent: Aug. 7, 2018

(54) CLOCK RECOVERY DEVICE AND METHOD

(71) Applicant: NOVATEK MICROELECTRONICS CORP., HsinChu (TW)

(72) Inventors: Wei-Sheng Tseng, Zhubei (TW); Chih-Lu Wei, Taipei (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/667,716

(22) Filed: Aug. 3, 2017

(51) Int. Cl.
| | |
|---|---|
| H03L 7/06 | (2006.01) |
| H03L 7/08 | (2006.01) |
| H03L 7/097 | (2006.01) |
| H03L 7/183 | (2006.01) |
| H03L 7/089 | (2006.01) |
| H03L 7/107 | (2006.01) |
| H04L 7/033 | (2006.01) |

(52) U.S. Cl.
CPC .......... *H03L 7/0807* (2013.01); *H03L 7/0891* (2013.01); *H03L 7/097* (2013.01); *H03L 7/1072* (2013.01); *H03L 7/183* (2013.01); *H04L 7/0331* (2013.01)

(58) Field of Classification Search
USPC .................. 327/147–149, 156–158
See application file for complete search history.

(56) References Cited

U.S. PATENT DOCUMENTS

| | | | | |
|---|---|---|---|---|
| 5,903,195 A | * | 5/1999 | Lukes .................... | H03L 7/095 327/156 |
| 6,842,057 B1 | * | 1/2005 | Gauthier ............... | H03L 7/0812 327/149 |
| 7,532,050 B2 | * | 5/2009 | Haerle .................. | H03L 7/0812 327/158 |
| 7,576,578 B2 | * | 8/2009 | Ikeda .................... | H03L 7/0895 327/157 |
| 7,663,417 B2 | * | 2/2010 | Rombach ............... | H03L 7/095 327/148 |
| 7,970,254 B2 | * | 6/2011 | Shiono ............... | G11B 7/00375 327/156 |
| 8,018,259 B2 | * | 9/2011 | Sanchez .................... | H03L 7/14 327/156 |
| 8,134,393 B1 | | 3/2012 | Nagaraj et al. | |
| 8,674,771 B2 | * | 3/2014 | Darabi .................. | H03L 7/0898 327/156 |
| 8,860,482 B1 | * | 10/2014 | Liu ........................ | H03L 7/099 327/148 |

(Continued)

*Primary Examiner* — Adam Houston
(74) *Attorney, Agent, or Firm* — McClure, Qualey & Rodack, LLP (57) ABSTRACT

A clock recovery device is provided. The clock recovery device includes a clock data recovery circuit and a fast relock circuit. The clock data recovery circuit is configured to generate an output clock signal in response to an input clock signal. The clock data recovery circuit includes a charge pump for generating a control voltage and a voltage controlled block for generating the output clock signal based on the control voltage. The fast relock circuit is configured to convert a comparison signal indicating a comparison result between the input clock signal and the output clock signal to an analog output voltage. When the charge pump is disabled, an output path of the fast relock circuit is turned on, and the analog output voltage is applied to an input of the voltage controlled block.

23 Claims, 6 Drawing Sheets (56) References Cited

U.S. PATENT DOCUMENTS

| | | | |
|---|---|---|---|
| 8,872,556 B1 * | 10/2014 | Chen | H03L 7/103 327/156 |
| 8,884,671 B2 * | 11/2014 | Grabinski | H03L 7/087 327/147 |
| 2007/0216454 A1 | 9/2007 | Fan et al. | |
| 2011/0181327 A1 * | 7/2011 | Shiobara | H03L 7/10 327/156 |
| 2013/0093482 A1 * | 4/2013 | Asaduzzaman | H03L 7/0814 327/157 |
| 2014/0320184 A1 * | 10/2014 | Chen | H03L 7/0891 327/157 |

\* cited by examiner

CLOCK RECOVERY DEVICE AND METHOD

TECHNICAL FIELD

The disclosure relates in general to a clock recovery device, and more particularly to fast relocking mechanism used in a clock recovery device.

BACKGROUND

Clock recovery devices have been widely used in display drivers and communication circuits. Exemplary clock recovery devices include a delay locked loop (DLL) and a phase locked loop (PLL). A DLL is an electronic circuit that takes an input signal and outputs multiple phase delayed signals. A PLL is an electronic circuit which typically includes a voltage controlled oscillator that is constantly adjusted to match the frequency of an input clock signal. Circuits include DLLs and PLLs may operate in a low power sleep mode in order to save power consumption. However, DLLs and PLLs require a certain amount of time to stabilize and acquire a feedback lock on the input signal. Such transient lock time may become a significant period in modern high speed circuits. Thus there is a need for a fast relocking mechanism when circuits including DLLs or PLLs exit the low power sleep mode.

SUMMARY

The disclosure is directed to a clock recovery device and method, such that fast relock can be achieved in the clock recovery device.

According to one embodiment of the invention, a clock recovery device is provided. The clock recovery device includes a clock data recovery circuit and a fast relock circuit. The clock data recovery circuit is configured to generate an output clock signal in response to an input clock signal. The clock data recovery circuit includes a charge pump for generating a control voltage and a voltage controlled block for generating the output clock signal based on the control voltage. The fast relock circuit is configured to convert a comparison signal indicating a comparison result between the input clock signal and the output clock signal to an analog output voltage. When the charge pump is disabled, an output path of the fast relock circuit is turned on, and the analog output voltage is applied to an input of the voltage controlled block.

According to one embodiment of the invention, a clock recovery method is provided. The clock recovery method includes the following steps. Generating an output clock signal in response to an input clock signal by a clock data recovery circuit. The clock data recovery circuit includes a charge pump for generating a control voltage and a voltage controlled block for generating the output clock signal based on the control voltage. Convert a comparison signal to an analog output voltage by a fast relock circuit, the comparison signal indicating a comparison result between the input clock signal and the output clock signal. Turn on an output path of the fast relock circuit and apply the analog output voltage to an input of the voltage controlled block when the charge pump is disabled.

The invention will become apparent from the following detailed description of the non-limiting embodiments. The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A clock recovery device, which typically includes a DLL or a PLL, may be used in many circuits, such as a network receiver and a display driver. In the display driver example, a power saving recovery device may switch to operate in a sleep mode in the vertical blanking time interval between successive image frames. For example, the DLL in a source driver may be disabled in the sleep mode to save power consumption. If the relock time of the DLL after leaving the sleep mode can be reduced, the duration of the sleep mode can be increased, and thus more power can be saved. Moreover, the DLL may be disabled in the horizontal blanking time interval between successive image lines if the relock time is fast enough. The relock time refers to how long it takes for the DLL to reach the locked state after waking up from the sleep mode. The fast relock mechanism used in the proposed clock recovery device will be described in the following several embodiments.

In some embodiments, through detection of a frequency of an input signal, an initial value of a control voltage for controlling a locked loop can be optimized, which means that an initial frequency and an initial control voltage can be quite close to a target frequency and a target control voltage and thereby achieves a fast locking. Compared to conventional technologies, the embodiment can have faster locked time without being influenced by circuit instability.

In some embodiments, an output of a digital frequency detector can be used to control a control voltage generated by a DAC. Characteristics of digital circuits have better resistance to process, voltage and temperature (PVT) variation effects. In addition, under a DLL architecture, dead lock and harmonic lock may be prevented. Moreover, through an appropriate setting of the initial voltage, the embodiments can achieve fast relocking from a sleep mode.

Figure 1:
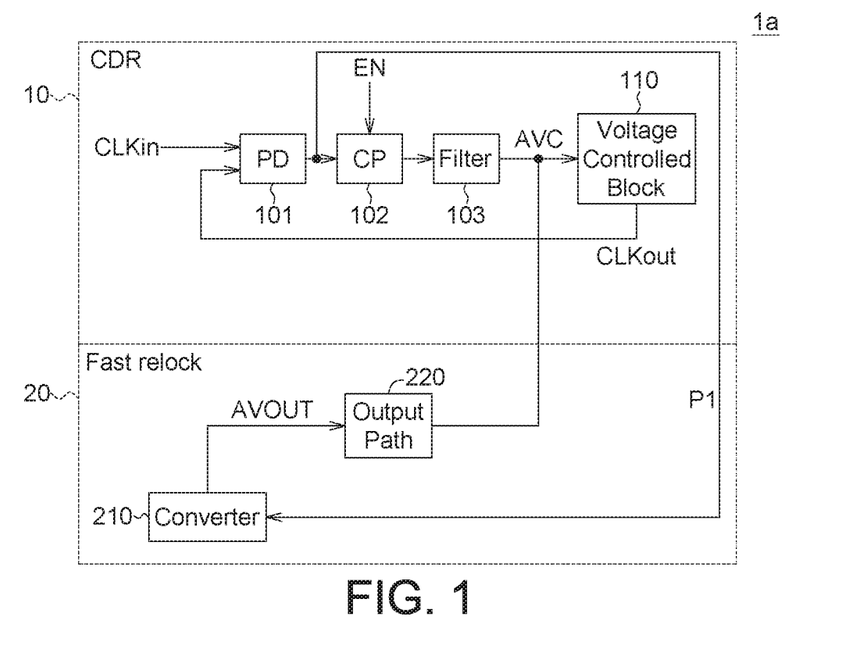
FIG. 1 shows a diagram illustrating a clock recovery device according to one embodiment of the invention.

FIG. 1 shows a diagram illustrating a power saving clock recovery device 1a according to one embodiment of the invention. The clock saving clock recovery device 1a includes a clock data recovery (CDR) circuit 10 and a fast relock circuit 20. The clock data recovery circuit 10 is configured to generate an output clock signal CLKout in response to an input clock signal CLKin. The clock data recovery circuit 10 may include a phase detector (PD) 101, a charge pump (CP) 102, a loop filter 103, and a voltage controlled block 110. The phase detector 101 may detect the phase difference between the input clock signal CLKin and the output clock signal CLKout. The loop filter 103 may include a capacitor. The charge pump 102 in accompany with the loop filter 103 may be configured to generate a control voltage AVC in response to the phase leading/lagging detection result generated by the phase detector 101. In this embodiment the charge pump 102 may be enabled or disabled by an enable control signal EN. The voltage controlled block 110 may be configured to generate the output clock signal CLKout based on the control voltage AVC. In a DLL type CDR circuit, the voltage controlled block 110 may include a voltage controlled delay line (VCDL). In a PLL type CDR circuit, the voltage controlled block 110 may include a voltage controlled oscillator (VCO). The architecture shown for CDR circuit 10 is only an example and any available architecture can be applied to the CDR circuit 10.

The fast relock circuit 20 is configured to convert a comparison signal P1 to an analog output voltage AVOUT. For example, the fast relock circuit 20 includes a converter 210 for generating the analog output voltage AVOUT. The comparison signal P1 indicates a comparison result between the input clock signal CLKin and the output clock signal CLKout. The comparison signal P1 can be provided by the CDR circuit 10 or alternatively can be generated by the fast relock circuit 20 based on an output signal generated by the CDR circuit 10. In the embodiment shown in FIG. 1, the comparison signal P1 is provided by the phase detector 101. When the charge pump 102 is disabled, an output path 220 of the fast relock circuit 20 is turned on, and the analog output voltage AVOUT is applied to an input of the voltage controlled block 110.

In one embodiment, the charge pump 102 may be disabled (turned off) in a sleep mode to save power. According to the embodiment described above, because the analog output voltage AVOUT is generated according to the comparison signal P1, the voltage level of the analog output voltage AVOUT can be close to a voltage level of the control voltage AVC in the locked state. Because the analog output voltage AVOUT is provided to the voltage controlled block 110 when the charge pump 102 is disabled (sleep mode), the initial voltage level of the control voltage AVC after exiting from the sleep mode can be close to the target voltage level of the control voltage AVC in the locked state, and therefore fast relock can be achieved.

Figure 7:
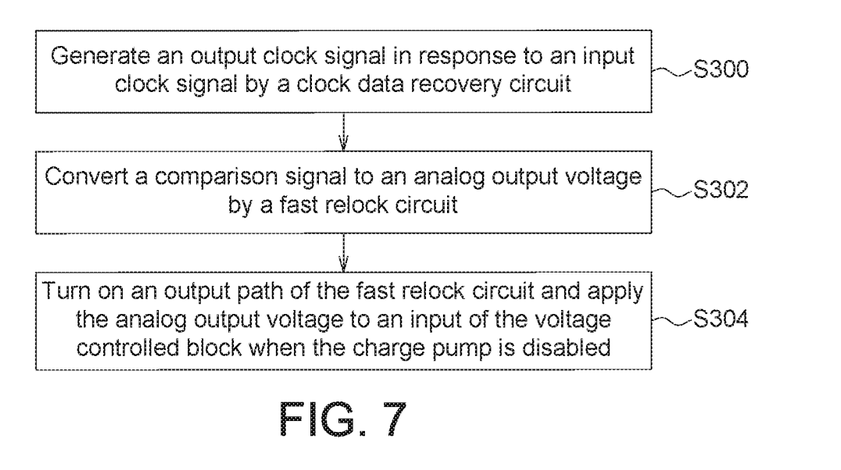
FIG. 7 shows a flowchart illustrating a clock recovery method according to one embodiment of the invention.

FIG. 7 shows a flowchart illustrating a power saving clock recovery method according to one embodiment of the invention. The flowchart provides a power saving clock recovery method which can be applied to (but not limitedly) the embodiment shown in FIG. 1. The power saving clock recovery method includes the following steps. Step S300: Generate an output clock signal CLKout in response to an input clock signal CLKin by a clock data recovery circuit 10. The clock data recovery circuit 10 includes a charge pump 102 for generating a control voltage AVC and a voltage controlled block 110 for generating the output clock signal CLKout based on the control voltage AVC. Step S302: Convert a comparison signal P1 to an analog output voltage AVOUT by a fast relock circuit 20, the comparison signal P1 indicating a comparison result between the input clock signal CLKin and the output clock signal CLKout. Step S304: Turn on an output path 220 of the fast relock circuit 20 and apply the analog output voltage AVOUT to an input of the voltage controlled block 110 when the charge pump 102 is disabled.

Figure 2:
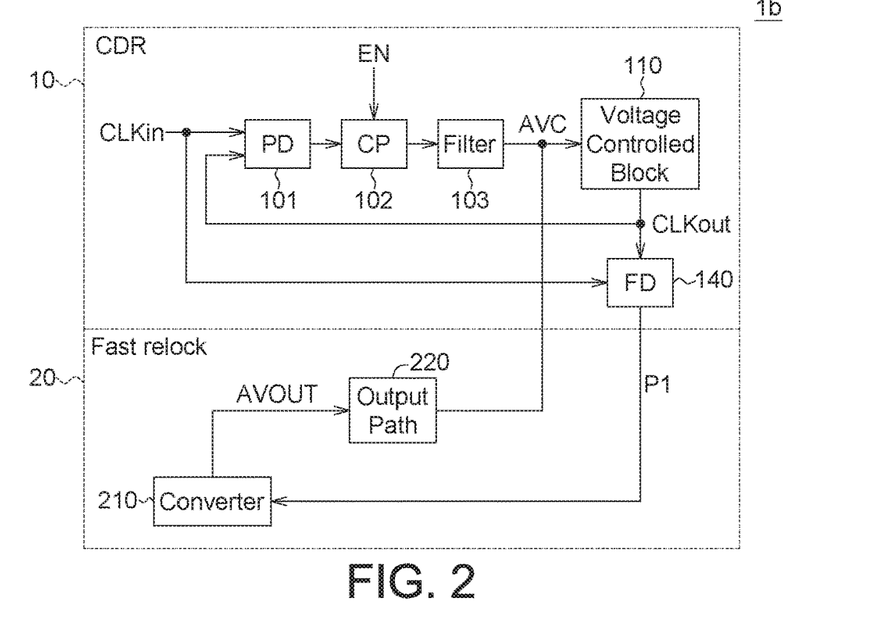
FIG. 2 shows a diagram illustrating a clock recovery device according to one embodiment of the invention.
Figure 3:
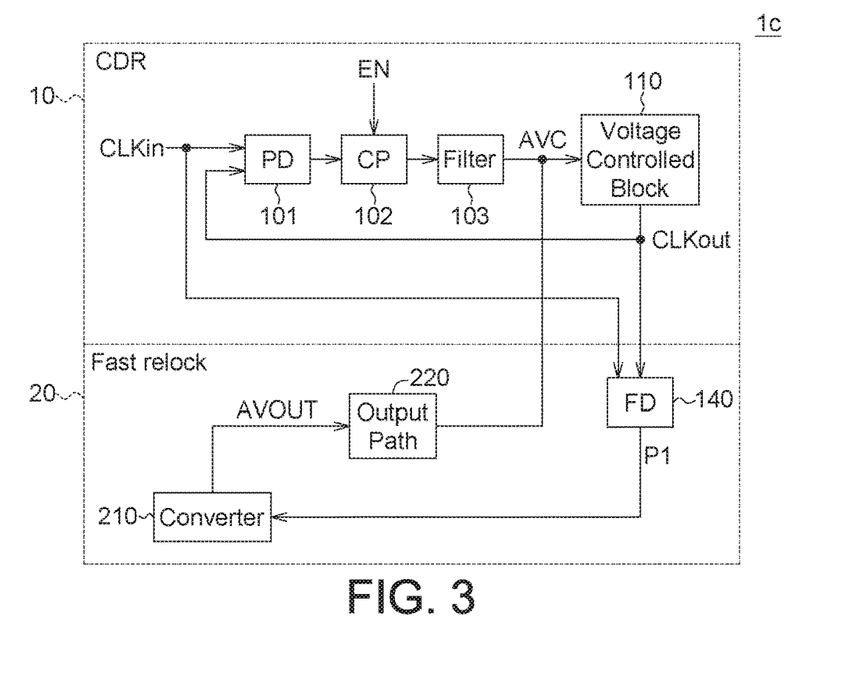
FIG. 3 shows a diagram illustrating a clock recovery device according to one embodiment of the invention.

It is noted the comparison signal P1 may be provided by different circuit blocks in different embodiments. FIG. 2 shows a diagram illustrating a power saving clock recovery device 1b according to another embodiment of the invention. In the embodiment shown in FIG. 2, the clock data recovery circuit 10 may include a frequency detector (FD) 140. The frequency detector 140 may be configured to compare the input clock signal CLKin and the output clock signal CLKout to generate the comparison signal P1. FIG. 3 shows a diagram illustrating a power saving clock recovery device 1c according to further another embodiment of the invention. In the embodiment shown in FIG. 3, the fast relock circuit 20 may include a frequency detector 140. The frequency detector 140 may be configured to compare the input clock signal CLKin and the output clock signal CLKout to generate the comparison signal P1. The comparison signal P1 may be a polarity signal, indicating whether the frequency of the input clock signal CLKin is higher than or lower than the frequency of the output clock signal CLKout. In more other embodiments, any signal which can represent a difference between the phase/frequency of the input clock signal and the output clock signal can be utilized as the comparison signal to be provided to the fast relock circuit for generating the control voltage.

It is noted in some embodiments, the frequency detector 140 shown in FIG. 2 and FIG. 3 may be implemented by a digital circuit. The digital frequency detector effectively avoids the problem of input offset and mismatch encountered in analog comparators. Moreover, the digital frequency detector has the property of better resilience to PVT (process, voltage, temperature) variations as compared to analog circuits.

Figure 4:
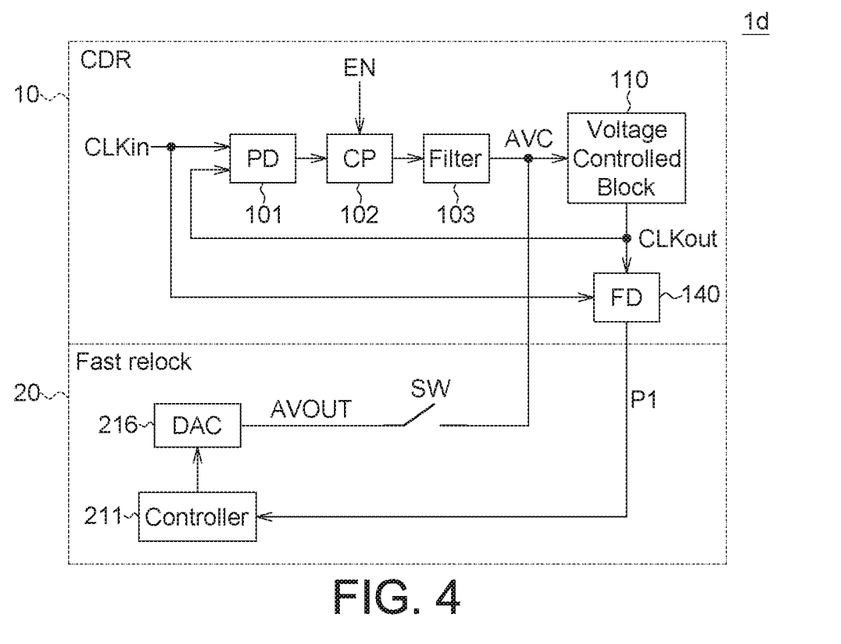
FIG. 4 shows a diagram illustrating a clock recovery device according to one embodiment of the invention.

FIG. 4 shows a diagram illustrating a power saving clock recovery device 1d according to another embodiment of the invention. The embodiment also shows a detailed structure of fast reclock circuit that can be applied to (but not limitedly) any of FIGS. 1-3. In this embodiment, the fast relock circuit 20 includes a controller 211, a digital-to-analog converter (DAC) 216, and a switch SW. The controller 211 is configured to generate a digital code in response to the comparison signal P1. The digital code may have N bits, for example, N is an integer ranging from 4 to 10. The bit width of the digital code may be adjusted based on the resolution and speed requirements. The DAC 216 is configured to convert the N-bit digital code to the analog output voltage AVOUT. The switch SW is coupled between the DAC 216 and the input of the voltage controlled block 110 of the clock data recovery circuit 10. The switch SW is configured to turn on or off the output path 220 of the fast relock circuit 20.

Figure 8:
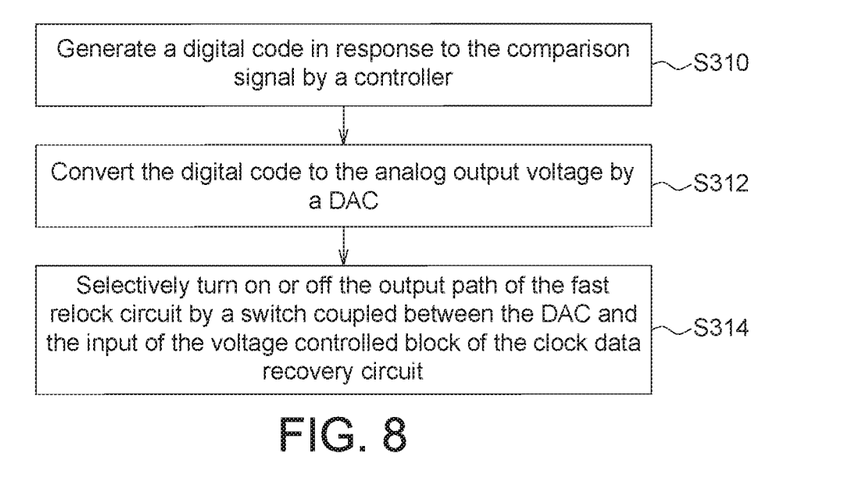
FIG. 8 shows a flowchart illustrating the step of converting the comparison signal to the analog output voltage according to one embodiment of the invention.

The corresponding flowchart of the power saving clock recovery method may be referred to FIG. 8, which shows a flowchart illustrating the step of converting the comparison signal to the analog output voltage (e.g., the step S302 shown in FIG. 7) according to one embodiment of the invention. Step S310: Generate a digital code in response to the comparison signal P1 by a controller 211. Step S312: Convert the digital code to the analog output voltage AVOUT by a DAC 216. Step S314: Selectively turn on or off the output path 220 of the fast relock circuit 20 by a switch SW coupled between the DAC 216 and the input of the voltage controlled block 110 of the clock data recovery circuit 10.

There may be several implementations for the controller 210. For example, the controller 211 sets the digital code based on whether the comparison signal P1 indicates UP (the input clock signal CLKin is faster than the output clock signal CLKout) or DOWN (the input clock signal CLKin is slower than the output clock signal CLKout). In one embodiment, the controller 211 includes an accumulator. The accumulator may gradually increment or decrement the digital code by a step size (for example, the step size equals 1) based on the comparison signal P1. In another embodiment, the controller 211 includes a successive approximation register controller (SARC). The SARC sets the digital code in a binary-search manner. For example, the SARC may set the digital code from the most significant bit (MSB) to the least significant bit (LSB) based on the comparison signal P1.

Figure 5:
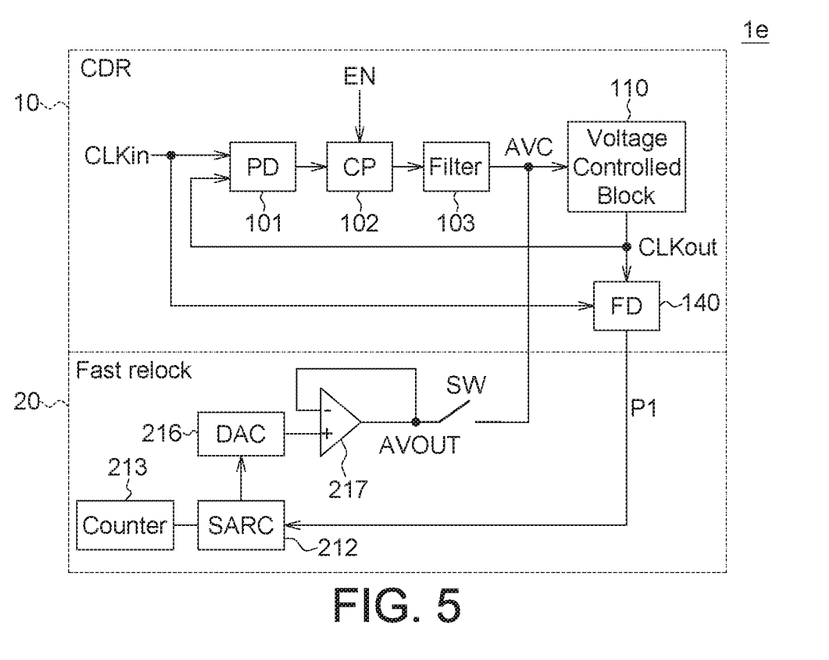
FIG. 5 shows a diagram illustrating a clock recovery device according to one embodiment of the invention.

FIG. 5 shows a diagram illustrating a power saving clock recovery device 1e according to one embodiment of the invention. In this embodiment the fast relock circuit 20 includes an operation amplifier 217 coupled to the output of the DAC 216. The operation amplifier 217 acts as a buffer to provide sufficient driving strength. The controller 211 includes a SARC 212 and a counter 213 coupled to the SARC 212. Note that in this embodiment, the SARC 212 may also be replaced by an accumulator. The function of the counter 213 will be described later.

Figure 6:
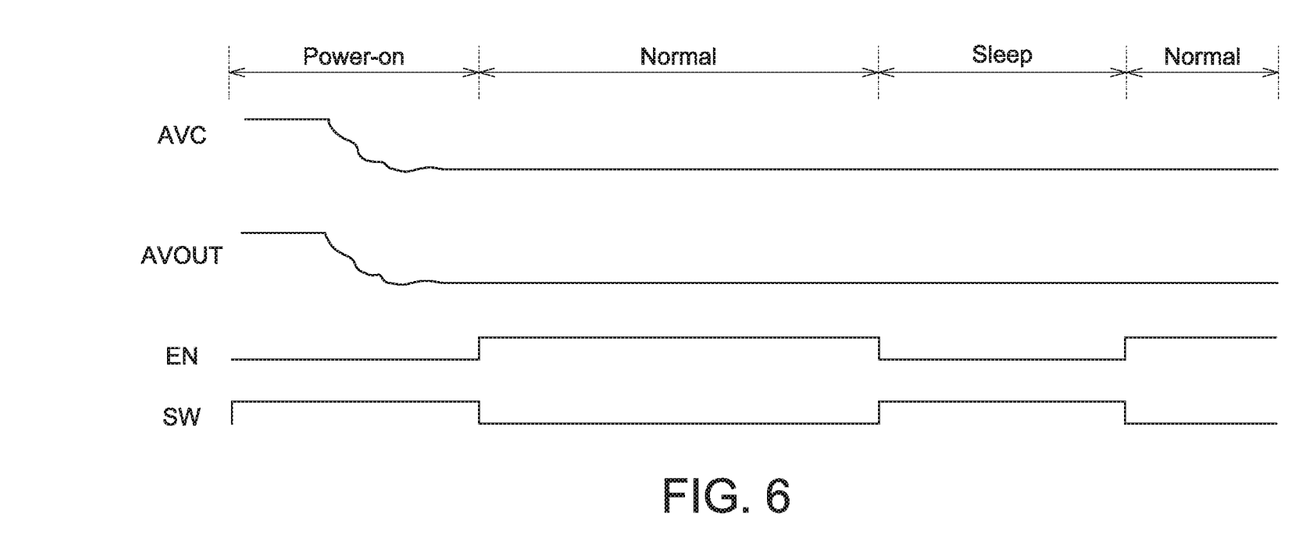
FIG. 6 shows a timing diagram illustrating operation modes and control signal waveforms according to one embodiment of the invention.

The detailed operation modes of the power saving clock recovery device are described in accompany with the embodiments shown in FIG. 1-FIG. 5. The power saving clock recovery devices 1a-1e may switch operation between a power-on mode, a normal operation mode, and a sleep mode. FIG. 6 shows a timing diagram illustrating operation modes and control signal waveforms according to one embodiment of the invention. In one embodiment, the power saving clock recovery devices 1a-1e are configured to alternate operation between the normal operation mode and the sleep mode after the power-on mode ends.

When the power saving clock recovery device 1a-1e is initially turned on, it enters the power-on mode. In the power-on mode, the charge pump 102 is disabled, the fast relock circuit 20 is enabled to operate, and the output path 220 of the fast relock circuit 20 is turned on. In other words, the charge pump 102 is not working in the power-on mode, and the control voltage AVC is directly provided by the analog output voltage AVOUT. As shown in FIG. 6, in the power-on mode, the charge pump 102 is disabled by the enable control signal EN. The switch SW shown in FIG. 4 is turned on (the output path 220 shown in FIG. 1 is turned on). The controller 211 (which may include a SARC or an accumulator) sets the digital code according to the comparison signal P1. For example, for an N-bit digital code, the SARC 212 spends N clock cycles to completely set the digital code. The DAC 216 outputs the analog output voltage AVOUT (provided to the control voltage AVC) such that the output clock signal CLKout is locked on with the input clock signal CLKin. In the power-on mode, the control voltage AVC in the clock data recovery circuit 10 is provided by the fast relock circuit 20. The fast relock circuit 20 successfully finds out a nominal value or a standard value for the control voltage AVC, and the fast relock circuit 20 stores this value in the form of the digital code provided to the DAC 216 as well as the analog output voltage AVOUT.

In the normal operation mode, the charge pump 102 is enabled, and the output path 220 of the fast relock circuit 20 is turned off. The switch SW shown in FIG. 4 is turned off. In the normal operation mode, the phase detector 101 and the charge pump 102 work as in normal DLL or PLL circuits to make the output clock signal CLKout in lock with the input clock signal CLKin. The control voltage AVC is isolated from the analog output voltage AVOUT in the normal operation mode.

In the sleep mode, the charge pump 102 is disabled, the fast relock circuit 20 is disabled to stop operating, and the output path 220 of the fast relock circuit 20 is turned on. The switch SW shown in FIG. 4 is turned on. In the sleep mode, the analog output voltage AVOUT indicating the stored value in the fast relock circuit 20 is provided to the control voltage AVC, setting the initial voltage level for the control voltage AVC for the upcoming normal operation mode. Because the stored value in the fast relock circuit 20 (which may be obtained in the power-on mode) is close to the target voltage level of the control voltage AVC in the locked state, fast relock can be achieved after waking up from the sleep mode.

Figure 9:
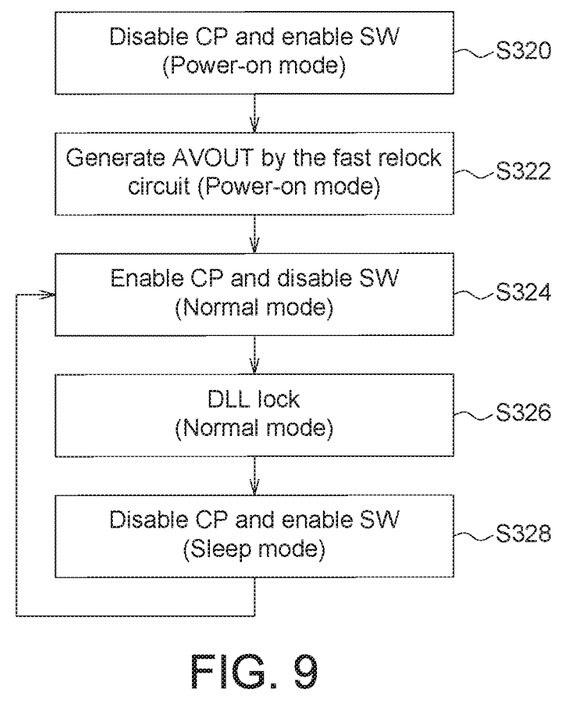
FIG. 9 shows a flowchart illustrating a clock recovery method switching between different operation modes according to one embodiment of the invention.

FIG. 9 shows a flowchart illustrating a power saving clock recovery method switching between different operation modes according to one embodiment of the invention. Step S320: disable the charge pump 102 and enable the switch SW in the power-on mode. Step S322: generate the analog output voltage AVOUT by the fast relock circuit 20 in the power-on mode. Step S324: enable the charge pump 102 and disable the switch SW in the normal operation mode. Step S326: normal DLL lock operation (or normal PLL lock operation) in the normal operation mode. Step S328: disable the charge pump 102 and enable the switch SW in the sleep mode. The analog output AVOUT is applied to the control voltage AVC in the sleep mode. In one embodiment, the steps S320 and S322 (power-on mode) are executed once, and the steps S324, S326, and S328 may be repeated several times.

Two embodiments are given below regarding the operation of the fast relock circuit 20 in the normal operation mode. In the first embodiment, the fast relock circuit 20 is disabled to stop operating in the normal operation mode. Referring to FIG. 5, the counter 213 is not needed in the first embodiment. In this embodiment, the digital code generated by the controller 211 is kept the same after the power-on mode. That is, the SARC 212 no longer reacts to any change in the comparison signal P1 once the power-on mode ends. The digital code is kept constant in the normal operation mode and the sleep mode. For example, the SARC 212 may be implemented with an auto-locking capability, disabling itself after completely setting the digital code from the MSB to the LSB. In this embodiment, the initial voltage level of the control voltage AVC every time the normal operation mode starts is the same (which has been set in the power-on mode). The hardware design is simpler and the power consumption is lower than the second embodiment described below.

In the second embodiment, the fast relock circuit 20 is enabled to operate in the normal operation mode. The counter 213 shown in FIG. 5 is needed in the second embodiment. In this embodiment, the fast relock circuit 20 keeps tracking the control voltage AVC even in the normal operation mode. The analog output voltage AVOUT effectively keeps track of the latest result of the control voltage AVC before entering the sleep mode. In other words, the analog output voltage AVOUT remembers the previous result of the control voltage AVC when locked on. The initial voltage level of the control voltage AVC when one normal operation mode starts is close to the final voltage level of the control voltage AVC in the previous normal operation mode. The advantage of the second embodiment is faster relock time as compared to the first embodiment.

Because the control voltage AVC typically does not deviate much once the power-on mode ends, the digital code in the normal operation mode is usually slightly modified. Referring to FIG. 5, the digital code may be set by the SARC 212 in the power-on mode, and the digital code may be fine-tuned by the counter 213 in the normal operation mode. For example, in the normal operation mode, the counter 213 may increment the digital code by 1 when the comparison signal P1 indicates UP, and the counter 213 may decrement the digital code by 1 when the comparison signal P1 indicates DOWN. Note that the SARC 212 may also be replaced by an accumulator. That is, the controller 211 may include an accumulator coupled to a counter, wherein the operation of the counter is the same as described above.

According to the embodiments given above, the power saving clock recovery device and method can achieve fast relock after waking up from the sleep mode. The fast relock circuit is able to appropriately set the analog output voltage in the power-on mode. By providing the analog output voltage to the control voltage in the sleep mode, the control voltage in the sleep mode can be close to the control voltage in the normal operation mode, and thus the relock time can be effectively reduced. Fast relock can also result in better power saving capability since the duration of the sleep mode can be extended. In addition, a digital frequency detector can be incorporated to generate the comparison signal. The digital frequency detector avoids the problem of input offset and mismatch encountered in analog comparators. Also the digital frequency detector is more resilient to PVT variations as compared to the analog circuit. The proposed clock recovery device and method can be applied to both DLL and PLL circuits and hence can be used in a wide range of applications.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A clock recovery device, comprising:
    a clock data recovery circuit, configured to generate an output clock signal in response to an input clock signal, wherein the clock data recovery circuit comprises a charge pump for generating a control voltage and a voltage controlled block for generating the output clock signal based on the control voltage; and
    a fast relock circuit, configured to convert a comparison signal indicating a comparison result between the input clock signal and the output clock signal to an analog output voltage, wherein when the charge pump is disabled, an output path of the fast relock circuit is turned on, and the analog output voltage is applied to an input of the voltage controlled block.

2. The clock recovery device according to claim 1, wherein the clock data recovery circuit further comprises a frequency/phase detector for comparing the input clock signal and the output clock signal to generate the comparison signal.

3. The clock recovery device according to claim 1, wherein the fast relock circuit further comprises a frequency/phase detector for comparing the input clock signal and the output clock signal to generate the comparison signal.

4. The clock recovery device according to claim 1, wherein the fast relock circuit further comprises:
    a controller, configured to generate a digital code in response to the comparison signal;
    a digital-to-analog converter (DAC), configured to convert the digital code to the analog output voltage; and
    a switch, coupled between the DAC and the input of the voltage controlled block of the clock data recovery circuit, and configured to turn on or off the output path of the fast relock circuit.

5. The clock recovery device according to claim 4, wherein the controller comprises a successive approximation register controller (SARC).

6. The clock recovery device according to claim 5, wherein the controller further comprises a counter coupled to the SARC.

7. The clock recovery device according to claim 4, wherein the controller comprises an accumulator.

8. The clock recovery device according to claim 7, wherein the controller further comprises a counter coupled to the accumulator.

9. The clock recovery device according to claim 1, wherein in a power-on mode, the charge pump is disabled, the fast relock circuit is enabled to operate, and the output path of the fast relock circuit is turned on.

10. The clock recovery device according to claim 1, wherein in a normal operation mode, the charge pump is enabled, and the output path of the fast relock circuit is turned off.

11. The clock recovery device according to claim 10, wherein in the normal operation mode, the fast relock circuit is disabled to stop operating.

12. The clock recovery device according to claim 10, wherein in the normal operation mode, the fast relock circuit is enabled to operate.

13. The clock recovery device according to claim 1, wherein in a sleep mode, the charge pump is disabled, the fast relock circuit is disabled to stop operating, and the output path of the fast relock circuit is turned on.

14. The clock recovery device according to claim 1, wherein the voltage controlled block comprises a voltage controlled delay line.

15. The clock recovery device according to claim 1, wherein the voltage controlled block comprises a voltage controlled oscillator.

16. A clock recovery method, comprising:
    generating an output clock signal in response to an input clock signal by a clock data recovery circuit, wherein the clock data recovery circuit comprises a charge pump for generating a control voltage and a voltage controlled block for generating the output clock signal based on the control voltage;
    converting a comparison signal to an analog output voltage by a fast relock circuit, the comparison signal indicating a comparison result between the input clock signal and the output clock signal; and
    turning on an output path of the fast relock circuit and applying the analog output voltage to an input of the voltage controlled block when the charge pump is disabled.

17. The clock recovery method according to claim 16, further comprising:
    generating the comparison signal by a frequency/phase detector for comparing the input clock signal and the output clock signal.

18. The clock recovery method according to claim 16, wherein the step of converting the comparison signal to the analog output voltage comprises:

generating a digital code in response to the comparison signal by a controller;

converting the digital code to the analog output voltage by a digital-to-analog converter (DAC); and selectively turning on or off the output path of the fast relock circuit by a switch coupled between the DAC and the input of the voltage controlled block of the clock data recovery circuit.

19. The clock recovery method according to claim 16, wherein in a power-on mode, the charge pump is disabled, the fast relock circuit is enabled to operate, and the output path of the fast relock circuit is turned on.

20. The clock recovery method according to claim 16, wherein in a normal operation mode, the charge pump is enabled, and the output path of the fast relock circuit is turned off.

21. The clock recovery method according to claim 20, wherein in the normal operation mode, the fast relock circuit is disabled to stop operating.

22. The clock recovery method according to claim 20, wherein in the normal operation mode, the fast relock circuit is enabled to operate.

23. The clock recovery method according to claim 16, wherein in a sleep mode, the charge pump is disabled, the fast relock circuit is disabled to stop operating, and the output path of the fast relock circuit is turned on.

* * * * *